US006846739B1

(12) United States Patent
Cathey et al.

(10) Patent No.: US 6,846,739 B1
(45) Date of Patent: Jan. 25, 2005

(54) MOCVD PROCESS USING OZONE AS A REACTANT TO DEPOSIT A METAL OXIDE BARRIER LAYER

(75) Inventors: David A. Cathey, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/031,617

(22) Filed: Feb. 27, 1998

(51) Int. Cl.$^7$ .......................................... H01L 21/4763
(52) U.S. Cl. ...................... 438/627; 438/637; 438/643; 438/648; 438/650; 438/653; 438/656; 438/681
(58) Field of Search ................................ 438/625, 627, 438/635, 637, 643, 648, 650, 653, 656, 681, 785, 473

(56) References Cited

U.S. PATENT DOCUMENTS

| 5,069,747 A |   | 12/1991 | Cathey et al. ............... 156/643 |
|---|---|---|---|
| 5,436,188 A | * | 7/1995 | Chen ............................ 437/52 |
| 5,527,567 A | * | 6/1996 | Desu et al. |
| 5,612,254 A | * | 3/1997 | Mu et al. ..................... 437/195 |
| 5,619,393 A | * | 4/1997 | Summerfelt et al. |
| 5,629,229 A | * | 5/1997 | Si et al. .......................... 438/3 |
| 5,710,079 A | * | 1/1998 | Sukharev ..................... 438/778 |
| 5,739,579 A | * | 4/1998 | Chiang et al. .............. 257/635 |
| 5,817,572 A | * | 10/1998 | Chiang et al. .............. 438/624 |
| 5,891,513 A | * | 4/1999 | Dubin et al. .................. 427/98 |
| 6,277,436 B1 | * | 8/2001 | Stauf et al. |
| 6,495,458 B2 | * | 12/2002 | Marsh ......................... 438/681 |
| 6,573,182 B2 | * | 6/2003 | Sandhu et al. .............. 438/674 |

OTHER PUBLICATIONS

Verhaar, et al., "A 25 um Bulk Fill CMOS SRAM Cell Technology With Fully Overlapping Contacts," IEDM Technical Digest, pp. 473–476, International Electon Devices Meetings, San Francisco, CA Dec. 9–12, 1990.

J.E. Huheey, E.A. Keiter, and R.L. Keiter, "Principles of Structure and Reactivity," Harper Collings College Publishers 1993.
*Dictionary of Chemistry*, McGraw–Hill, pp. 348–349, 1997.
R.J. Lewis, Sr., *Hawley's Condensed Chemical Dictionary*, Twelfth Edition, Van Nostrand Reinhold Company, p. 1035, 1993.
Schumacher Material Safety Data Sheet: TMPO, pp. 1–4, May 1999.
Alfa Aesar Online Catalog (1 pg).
MSDS Material Safety Data Sheet: "Hexamethyldisilazane," pp. 1–8.
Schumacher Material Safety Data Sheet: TOMCATS, pp. 1–4, May 1999.
Schumacher Material Safety Data Sheet: TEB, pp. 1–4, May 1999.
Schumacher Material Safety Data Sheet: TEOS, pp. 1–5, May 1999.
Graph: Tungsten Deposition 2 (1 pg).
Graph: Chemical Mechanical Polish (1 pg).
TimeDomain CVD, "TEOS/Ozone Thermal CVD," pp. 1–5, online Jul. 10, 2000.
TimeDomain CVD, "TEOS/Oxygen Thermal CVD," pp. 1–3, online Jul. 10, 2000.

* cited by examiner

*Primary Examiner*—M. Wilczewski
(74) *Attorney, Agent, or Firm*—Workman Nydegger

(57) ABSTRACT

An inventive process is disclosed for creating a barrier layer on a silicon substrate of an in-process integrated circuit. The process uses MOCVD to form a metal oxide film. The source gas is preferably an organometallic compound. Ozone is used as an oxidizing agent in order to react with the source gas at a low temperature and fully volatilize carbon from the source gas. The high reactivity of ozone at a low temperature provides a more uniform step coverage on contact openings. The process is used to create etch stop layers and diffusion barriers.

16 Claims, 2 Drawing Sheets

MOCVD PROCESS USING OZONE AS A REACTANT TO DEPOSIT A METAL OXIDE BARRIER LAYER

BACKGROUND OF THE INVENTION

1. The Field of the Invention

The present invention relates to the formation of a barrier layer on an integrated circuit during the fabrication thereof. More particularly, the present invention is directed to a process for depositing a metal oxide etch stop or diffusion barrier on a semiconductor substrate of an integrated circuit using MOCVD with ozone gas as an oxidant.

2. Background of the Invention

The movement toward the progressive miniaturization of semiconductor integrated circuits has resulted in increasingly compact and efficient semiconductor structures. This movement has been accompanied by an increase in the complexity and number of such structures aggregated on a single semiconductor integrated chip. As feature sizes are reduced, new problems arise which must be solved in order to economically and reliably produce the semiconductor devices that are situated upon semiconductor substrates. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. Including in the definition of semiconductor substrate are structures such as silicon-on-sapphire and silicon-on-insulator.

As an example, submicron features of the semiconductor devices in semiconductor manufacturing are now required and have necessitated the development of improved means of making contact with the various structures of the devices on the semiconductor substrate of the integrated circuit. The smaller and more complex devices are achieved, in part, by reducing feature sizes and spacing and by reducing the junction depth of regions formed in the semiconductor substrate. Among the features which are being reduced in size are the contact openings through which electrical contact is made to underlying active regions in the semiconductor devices. Another related feature being reduced in size is the via openings through which different structural layers on the integrated circuit are provided with electrical communication.

One problem that has arisen when making contact to the various isolated regions on an integrated circuit is controlling the selectivity with which a contact or via opening is etched. The goal in etching is to provide an opening that is of uniform width and that ends exactly to the surface of the region sought to be accessed without intruding upon the region. Unfortunately, the etchant materials have proven difficult to control, making it a challenge to prevent the resulting opening from being etched too widely or deeply.

A second problem that typically arises after the via or contact opening has been etched is that of preventing the metallization material from reacting with the underlying region to which is being provided electrical communication. Historically, device interconnections have been made with aluminum or aluminum alloy metallization. Aluminum, however, presents the problem of spiking at junctions when brought into contact with a silicon containing material. Junction spiking is the result of the dissolution of silicon into the aluminum metallization, as well as the dissolution of aluminum into the silicon containing material. Typically, when aluminum contacts the doped silicon of the region directly, the aluminum eutectically alloys with the silicon at temperatures as low or lower than 450° C. When such a reaction occurs, aluminum in the contact is often diffused into the silicon region from the contact, forming an alloy spike structure.

The resulting alloy spike structure is a sharp, pointed region enriched in aluminum. The alloy spikes can extend into the interior of the underlying silicon substrate from the boundary between the contact and the underlying region to cause unwanted short circuit conduction. This particularly occurs when the underlying region is a junction in an active semiconductor device and is formed in an extremely shallow region of the substrate. When such an unwanted conduction occurs, the semiconductor device no longer operates properly. This problem is exacerbated with smaller device sizes, because the more shallow junctions are easily shorted, and because the silicon available to alloy with the aluminum metallization is only accessed through the small contact or via area, increasing the resultant depth of the spike. Furthermore, silicon in the region is often dissolved into the aluminum electrode, and there is a tendency for silicon thus dissolved into the electrode to be precipitated at a boundary between the electrode and the region as an epitaxial phase. This increases the resistivity across the contact.

A related problem exists when a doped region of silicon exists adjacent an undoped region, or when other doped and undoped regions must be located next to each other. When a region of silicon dioxide is laid above a doped region, for example, the silicon dioxide has a tendency to react with the dopant, depleting the dopant of the active region. As a further example, when an undoped region such as a polysilicon gate in a transistor is to be covered by doped oxide layer such as borophosphorosilicate glass (BPSG), a problem of the polysilicon assimilating the dopant of the oxide layer can occur.

As a solution to the problem of maintaining selectivity of the etch, it is known to deposit an etch stop barrier above the region that is to be isolated. A contact 10 being formed with a typical etch stop structure is shown in FIG. 1. In the formation of contact 10, a discrete region 14 is first formed within a semiconductor substrate 12. A polysilicon layer 15 is then formed over discrete region 14. An oxide layer 16 is then formed over polysilicon layer 15. A layer of photoresist 18 is applied, exposed over discrete region 14, and developed. A contact or via opening 20 is then etched through a masked opening in photo resist layer 18, polysilicon layer 15, and oxide layer 16. An etch stop layer 22 is formed from materials selected to be impervious to the etchant, and that can later be selectively removed by processes that will not affect the region. Etch stop layer 22 is deposited over the exposed portion of region 14 through opening 20 region 14. Etch stop layer 22 directs the etching of oxide layer 16. Photoresist layer is removed by cleaning and contact or via opening 20 is then filled with a metallization material 24.

Etch stop layer 22 may be deposited using a number of techniques, one of which is to deposit an aluminum oxide film barrier layer by sputter deposition. An example of this process is taught in R. D. J. Verhaar et al., A 25 Micrometer Squared Bulk Full CMOS SRAM Cell Technology With Fully Overlapping Contacts, International Electronic Devices Meeting Digest, December 1990, which is incorporated herein by reference.

As a solution to the problems associated with the reaction between the silicon substrate and the metallization material in contact and via formation, prior art solutions have typically used a diffusion barrier structure in which the reaction between the silicon substrate and the electrode is blocked by the diffusion barrier layer. Such a barrier layer prevents the interdiffusion of silicon and aluminum.

FIG. 2 depicts one conventional method known in the art of forming contacts and vias having a diffusion barrier. A contact 30 is depicted that is formed with a diffusion barrier 38. In forming contact 30, a region 34 is formed on silicon substrate 32. Region 34 is typically an active area of a semiconductor device, such as that of a transistor. An oxide layer 36 is formed over region 34, and a contact opening 40 is etched through oxide layer 36 to region 34. Oxide layer 36 typically comprises a doped silicon dioxide such as borophosphorosilicate glass (BPSG). Contact opening 40 provides access to active region 34 by which an electrical contact is made. A barrier layer 38 is then deposited over contact opening 40 so that the exposed surface of active region 34 is coated. Barrier layer 38 is typically deposited by CVD or sputtering.

The next step is metallization. This is typically achieved by the deposition of a metallization layer 42 such as aluminum using one of the various known methods, including CVD, sputtering, and aluminum reflow. Barrier layer 38 acts as a barrier against the diffusion of metallization layer 42 into active region 34 and vice-versa. When used in a via opening the process is essentially the same as that for forming a contact, as discussed above. FIG. 3 shows a second type of diffusion barrier used for separating adjacent regions on an integrated circuit. In FIG. 3, a doped polysilicon gate structure 54 is isolated from an underlying silicon substrate 52 and an overlying oxide layer 56 by a diffusion barrier 58.

Many choices of materials to form barriers are known in the art. One type of barrier layer that is used is formed from metal oxide ceramic compounds. See Verhaar et al., above. Layers formed from such compounds are used as both etch stop and diffusion barriers. They are removed after layering with chemical etchant processes. The difficulty with using metal oxide ceramic compounds as a barrier layer arises in deposition of the material. In sputter deposition, the targets are expensive to provide, and it has been found that sputter depositing does not provide adequate step coverage for increasingly small contact and via openings.

Another method of forming barrier layers with metal oxide ceramic compounds that has been tried in the past is chemical vapor deposition using organometallic source materials (MOCVD). When using this process, a source such as dimethyl aluminum hydrate is reacted with diatomic oxygen gas at high temperatures to form a metal oxide solid such as aluminum oxide, substantially in the form $Al_2O_3$. The other reaction products are carried away in the form of gases such as dimethyl hydrate $H(CH_4)_2$, CO or $CO_2$, and diatomic hydrogen.

The MOCVD method has several inherent drawbacks. For instance, it has proven difficult to provide even step coverage of contact and via openings with this process. At high temperatures the source gas exhibits a low thermal surface mobility lifetime in that the organometallic source gas decomposes and reacts with the sides of the opening before reaching the bottom of the opening. This is a result of the high temperatures that are necessary to oxidize the source gas with diatomic oxygen gas. As a consequence, the openings must be formed with lower aspect ratios, hindering miniaturization efforts.

Another problem inherent to MOCVD barrier layer formation is the entrapment of carbon in the aluminum oxide film. The carbon reacts slowly with the diatomic oxygen gas, and layers of aluminum oxide are deposited over the carbon before it can be volatilized and carried away. Due to the trapping of carbon molecules and the incomplete reaction of the carbon, the barrier layer takes on the characteristics of aluminum carbide, which typically does not function as an etch stop barrier. Consequently, the resultant barrier has an inability to maintain selectivity and resistance to diffusion. The resultant barrier becomes compromised by the formation of pinholes at the locations where the carbon has been entrapped. The etchant or metallization material is then able to penetrate the resultant barrier layer due to the pinholes.

From the foregoing discussion, it can be seen that it would be an advance in the art to provide a process of forming an effective etch stop or diffusion barrier layer in an effective form, such as a metal oxide barrier layer. Such a process would be beneficial if metal oxide barrier layers can be formed with good step coverage, without entrapped carbon, and without the use of expensive targets known to sputter deposition processing.

SUMMARY OF THE INVENTION

The present invention seeks to resolve the above and other problems which have been experienced in the art. More particularly, the present invention constitutes an advancement in the art by providing an improved method for creating a barrier layer on an integrated circuit during the fabrication thereof.

The present invention comprises a process for forming a metal oxide deposition barrier on a silicon substrate of an integrated circuit using MOCVD. Under the present invention, a vaporized metal is used as a source gas, preferably in the form of an organometallic compound, and gaseous ozone ($O_3$) is reacted with the source gas to form a metal oxide film which can be used as an etch stop or diffusion barrier.

The first step of the process comprises forming a region on a semiconductor substrate that is to later be isolated from materials deposited in future processes. The layer may simply be a doped region on the silicon substrate, or it can be polysilicon or some other deposited, grown, or otherwise formed material. The next step depends on whether the barrier layer is to be an etch stop layer or a diffusion barrier.

When the barrier layer is to be an etch stop layer, the barrier layer is formed directly over the region to be isolated. This is done by disposing the silicon substrate in a reaction chamber and exposing it to the source gas and the ozone. This is typically done at a very low pressure and at temperatures that are lower than those commonly used in the art. A temperature of around 300° C. is preferred, though higher temperatures will cause quicker reactions. The source gas and the ozone react together over the region, with the ozone replacing carbon bonds in the source gas. The ozone also volatilizes the other elements of the source gas, such as carbon and hydrogen. The chamber is then purged, and the silicon substrate is removed from the reaction chamber.

When the deposited barrier layer is to function as an etch stop, a oxide layer is typically formed over a region on the semiconductor substrate, followed by a masking a photolithography process. It is then etched, with the etch being selectively shaped by the etch barrier. Since the reaction forms an etch stop barrier that is primarily aluminum oxide rather than aluminum carbide, the etch will be uncompromised by entrapped carbon and proper selectivity will be maintained.

When the barrier layer to be formed is to function as a diffusion barrier, it may be formed in two ways. It may be formed directly over a region on a semiconductor substrate, as where the region is to be isolated from a later layered material. Additionally, when intended to be part of a contact or via opening, an oxide layer is grown over the region, the region is masked and etched in a photolithography process, and a process is conducted as described above of inserting the silicon substrate into a reaction chamber and exposing it to both a source gas and ozone at a low atmosphere and low temperature. The low temperature allows a longer life and better sticking coefficient of the source gas, and enables the source gas to migrate down the surface of the contact or via sidewalls so as to react at the bottom of the contact or via opening, and thereby produce a more even layer having uniform step coverage. The contact or via opening may then be metallized by sputter or reflow of aluminum or other materials. The metal oxide diffusion barrier prohibits the interaction of the metallization material with the underlying region. This prevents spiking and other undesirable effects.

Thus, the present invention provides a novel process for using MOCVD to create a metal oxide etch stop or diffusion barrier. The created barrier layer will not be compromised by entrapped carbon therein, and will provide uniform step coverage when formed on a contact or via opening. Furthermore, the present invention has advantages over sputter deposition in that expensive target materials need not be used, and the high reactivity of the gaseous ozone at low temperatures provides for a more uniform step coverage.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises a process for forming a metal oxide barrier layer during fabrication of an integrated circuit using a organometallic chemical vapor deposition process (MOCVD). The source gas is a vaporized metal containing compound. Ozone is employed as the oxidizing agent. The metal oxide film produced by the process of the present invention is more effective as a barrier layer due to the use of ozone as an oxidizing agent.

Ozone is highly reactive at lowered energy states and is easily reacted at low temperatures with gaseous sources such as organometallic compounds. Ozone is used as the oxidizing agent in the inventive MOCVD process, and allows the MOCVD process to be conducted at low temperatures. This, in turn, has led to the formation of improved etch stop and diffusion barrier layers using ceramic metal oxides.

The MOCVD process of the present invention involves a source gas which can comprise any metal-containing compound, but is preferably an organometallic gas. Even more preferably, the source gas of the present invention comprises a compound including at least one metal as well as both carbon and hydrogen. Examples of sources gases preferred for use with the present invention include aluminum trimethane, aluminum tetramethane, trimethyl aluminum hydrate, dimethyl aluminum hydrate, titanium tetramethane, and tantalum. The most preferred metal oxide barrier layer to be formed is aluminum oxide in the form of $Al_yO_x$, where y=2 and x=3, though other stoichiometric compounds of the oxides of aluminum are contemplated. Other preferred metal oxide barrier layers are titanium oxide, tantalum oxide, ruthenium oxide, and molybdenum oxide.

Figure 1:
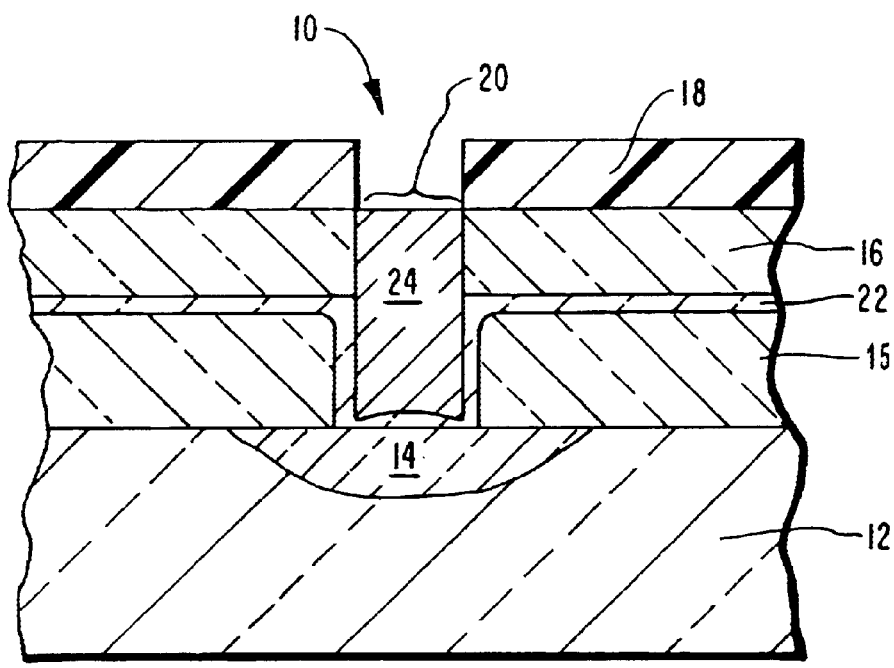
FIG. 1 is a perspective view of a contact utilizing a barrier layer as an etch stop barrier.
Figure 2:
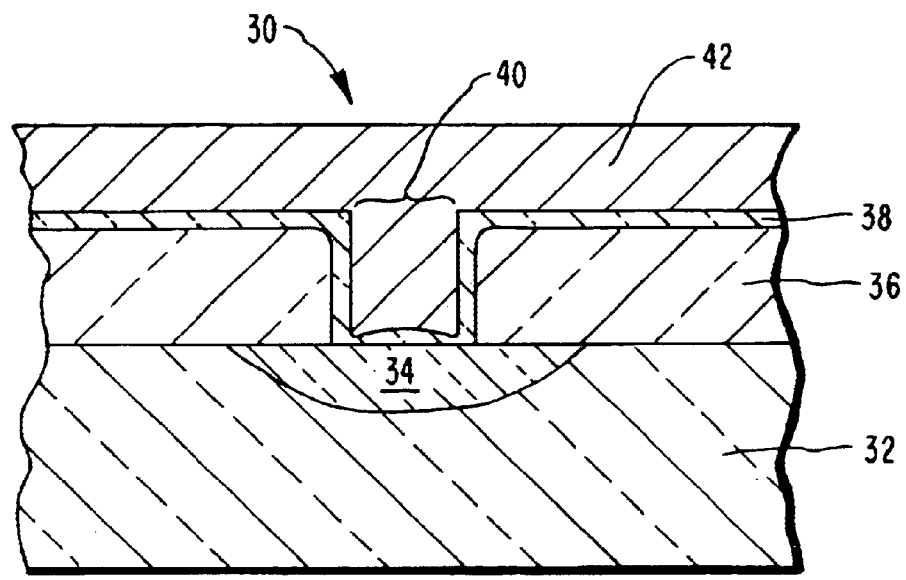
FIG. 2 is a perspective view of a contact utilizing a barrier layer as a diffusion barrier.
Figure 3:
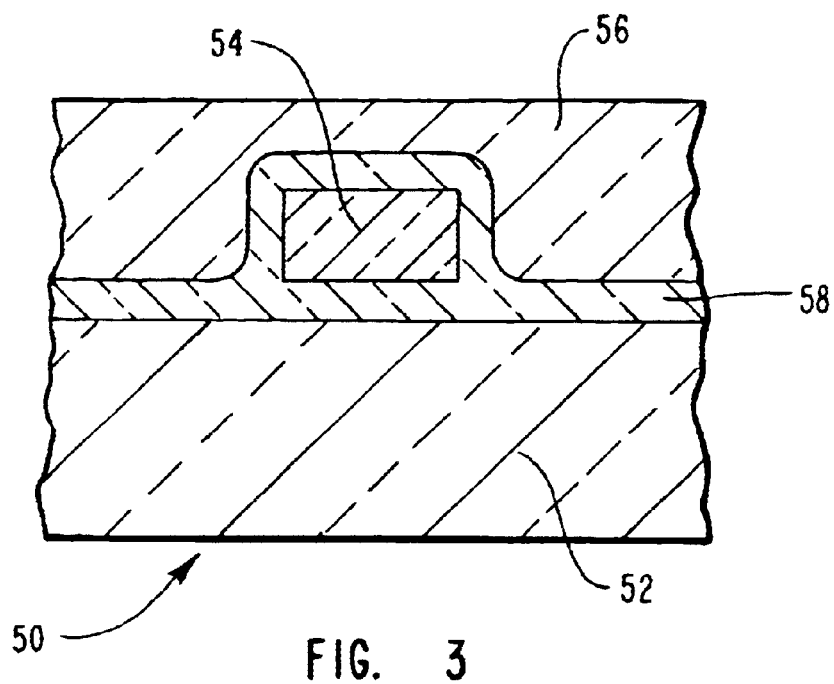
FIG. 3 is a perspective view of a contact utilizing a barrier layer as a diffusion barrier to isolate a polysilicon gate from an oxide layer on a silicon substrate.

The resultant metal oxide barrier layer is used under the present invention for such purposes as an etch stop barrier, with respect to FIG. 1, and as a diffusion barrier to prevent metallization material such as aluminum and aluminum alloys from reacting with the underlying active region, as described above in relation to FIG. 2. The diffusion barrier may also be used to prevent two adjacent doped and undoped regions from interacting as described with respect to FIGS. 3 and 4.

The production process of the integrated circuit in which the present invention is used typically comprises initially forming a discrete region as part of a semiconductor structure on a silicon substrate of an in-process integrated circuit. Typically, the discrete region will be a doped active region such as an N+ or a P+region, or will be a region of polysilicon material on devices such as resistors, diodes, and transistors.

When the metal oxide barrier layer of the present invention is intended for use in isolating the discrete region from making contact with other structural layers deposited in later procedures, the barrier layer is deposited directly over the underlying region using the process of the present invention. Masking processes, as known in the art, may be employed to select the area for deposition. A second structural layer is then deposited.

When the barrier layer is intended to function as an etch stop layer over a discrete region, the metal oxide barrier layer is formed over the discrete region using the inventive process and is then covered with an oxide layer. A contact is then formed by masking, etching, and metallization, as described in relation to FIG. 1, with the etch stop layer selectively determining the area of the etch.

When the barrier layer is to be used as a diffusion barrier to protect the active region from undesirable interaction with the composition of other layers, the barrier layer is first deposited in a contact opening using the process of the present invention. The contact opening is typically formed as described in relation to FIG. 2 above. Metallization of the contact is then performed. The diffusion barrier deposited by the present invention prevents contact of the region with the metallization material, thereby effectively avoiding detrimental effects such as spiking from occurring.

When the integrated circuit is formed having multiple structural levels, the levels are typically electrically connected with the use of a via. Under the present invention, the via can be formed using an etch stop layer and/or diffusion barrier in a manner similar to that of forming contacts, as described in relation to FIGS. 1 and 2.

When a discrete region is to be isolated from interdiffusion with an adjacent structural level, the metal oxide barrier layer of the present invention is used as a diffusion barrier, as described above in relation to FIGS. 3 and 4.

Figure 4:
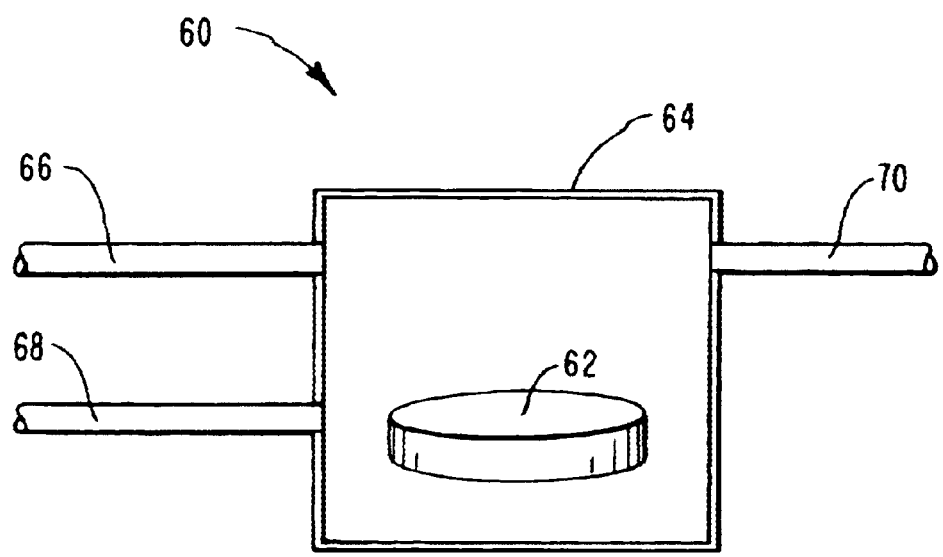
FIG. 4 is a perspective view of a reaction chamber containing a silicon substrate on which is formed a barrier layer according to the inventive process.

As an example of the process under the present invention of depositing the metal oxide barrier layer on a region to be isolated comprises the following steps. First, a region to be isolated by a barrier is formed by doping a portion of the silicon substrate, or growing or depositing a material on the silicon substrate, depending upon the device or structure being formed. If the barrier layer is to be an etch stop barrier, it will be deposited directly above the region as described with respect to FIG. 1. If the barrier layer is to be a diffusion barrier in a contact or via, the contact or via opening will first be formed as as described with respect to FIG. 2. The barrier layer is then formed, as shown in FIG. 4, by placing the in-process integrated circuit 62 and the region therein to be isolated within a reaction chamber 64 such as a CVD chamber. Reaction chamber 64 is then evacuated to a pressure preferably of about 0.1 to about 1 torr. Lower pressures will affect the temperature and/or the amount of time required for the reaction. Reaction chamber 64 is typically heated.

The source gas and an inert carrier gas are then pumped into the reaction chamber. The source gas is shown being pumped in through a conduit 66 and the inert carrier gas is shown being pumped in through a conduit 68. The source and carrier gases can also be mixed before being pumped into reaction chamber 64. Ozone is also pumped into reaction chamber 64. In FIG. 4, the ozone is shown being pumped in through a conduit 70. This causes a reaction to occur above the surface of integrated circuit 62 that forms a solid metal oxide film on the surface of the substrate over the discrete region that is to be isolated.

Chemical bonds between the metal and carbon groups in the organometallic source gas are replaced during the reaction with oxygen originating in the ozone oxidant. Carbon, hydrogen, and other elements of the source gas are volatilized in the same reaction, typically by being oxidized by reaction with ozone. The volatilized source gases are then suctioned away from the surface of the integrated circuit 62, leaving the metal oxide solid film deposited thereon. The reaction is allowed to continue for a selected duration, after which the reactants are shut off, the reaction chamber is purged with an inert gas, and the silicon substrate is removed.

The process of the present invention can be conducted at a lower temperature than with conventional processes using oxygen as an oxidant, due to the high reactivity of ozone. Higher temperatures result in quicker reactions and uneven step coverage, as discussed above, whereas with lower temperatures, the carbon is mote fully volatilized by the ozone and carried away from the surface before it can become entrapped in the metal oxide layer. Therefore, the metal oxide barrier layer is primarily metal oxide, which is not substantially compromised by entrapped carbon, and the integrity of the layer is maintained. Consequently, when the barrier layer functions as an etch stop, proper selectivity of the etch is maintained.

In the inventive process, the effectiveness of the organometallic source gas is extended by low temperatures of the reaction process. The low temperature of reaction lessens the propensity of the source gas to decompose and break down the chemical bonds thereof prematurely and without effectively reacting. When forming contacts or vias at lower temperatures, the source gas will have a higher sticking coefficient and will more readily migrate down the surface of the sidewalls of the contact or via opening to the bottom of the opening, where it will then react. The organometallic source gas at the bottom of the contact or via opening also reacts more fully at the lower temperature due to the highly reactive nature of the ozone. As a result, substantially all of the carbon bonds are replaced with oxygen, and a more uniform step coverage results. The uniform step coverage provides the advantage of a more effective barrier layer resulting in higher yield rates. It also allows for a higher aspect ratio of the contact or via opening to be used.

As an example of the inventive process, a source gas such as aluminum trimethane is reacted with ozone to deposit a solid layer of aluminum oxide preferably in the form of $Al_2O_3$ on the surface of a region to be isolated. The carbon and hydrogen of the reactants will be effectively volatilized by the ozone, having been oxidized into an essentially vaporous state, and will then be easily removed from the surface of the silicon substrate and the reaction chamber. An effective metal oxide barrier layer will thereby be formed on the surface of the region being isolated. It should be noted that the aluminum oxide may be in other molecular forms, such as $Al_2O_2$, without changing the nature of the invention, but should be primarily an oxide rather than a carbide. The aluminum oxide may be removed after a contact or via opening is formed using an etchant that is selective to aluminum oxide. One etchant that could be used is a solution of about 85% $CH_3PO_4$ at a temperature of about 60° C.

A similar process would occur with a source of aluminum tetramethane, trimethyl aluminum hydrate, and dimethyl aluminum hydrate. If the desired barrier layer material is titanium oxide, the process could be undertaken using titanium tetramethane as a source gas. A tantalum oxide could also be formed using tantalum as a source. Additionally, ruthenium oxide and molybdenum oxide could be formed under the inventive process using conventional source gases. It will be evident to one skilled in the art that other forms of vaporous metal compounds could be used with this process to deposit an effective metal oxide barrier layer.

As a result of this process, an etch stop barrier layer in a contact or via opening can be formed that will not be compromised by materials such as carbon from an organometallic source gas. The resulting contact or via has an opening providing an efficient electrical connection and low contact resistance. A contact using a diffusion barrier layer will have a more uniform step coverage, allowing for a high aspect ratios, and resulting in enhanced yield rates in fabrication.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by united states Letters Patent is:

1. A process for creating a barrier layer on a semiconductor substrate comprising:

forming a discrete region in the semiconductor substrate; and exposing a surface of the discrete region to a metal-containing source gas and to ozone gas to react the source gas with the ozone gas to form from the reaction a barrier layer of metal oxide film on the surface of the discrete region;

wherein the source gas is selected from the group consisting of aluminum trimethane, aluminum tetramethane, titanium tetramethane, a vaporized tantalum in the form of an organometallic compound, trimethyl aluminum hydrate, and a Ru or Mo metalorganic precursor.

2. A process as recited in claim 1, wherein the source gas and the ozone gas are reacted in a CVD process at a pressure of about 0.1 torr to about 100 torr.

3. A process as recited in claim 1, wherein the metal oxide film of the barrier layer is selected from the group consisting of a conductive metal oxide film, Ru oxide film, and aluminum oxide film.

4. A process as recited in claim 1, wherein the ozone gas volatilizes and frees into the atmosphere substantially all of the carbon contained in the source gas.

5. A process as recited in claim 1, wherein forming the discrete region is followed by covering the discrete region with an oxide layer and etching a contact opening through the oxide layer to contact the discrete region, and wherein a surface of the contact opening is covered with the barrier layer.

6. A process as recited in claim 5, wherein exposing the surface of the discrete region to a metal-containing source gas and ozone is followed by metallizing the contact opening with a metallization material, wherein the barrier layer functions as a diffusion barrier to substantially prevent the metallization material from contacting the discrete region.

7. A process as recited in claim 6, wherein the diffusion barrier is in electrical communication with the discrete region.

8. A process as recited in claim 5, wherein the discrete region is covered with a second structural layer, with the discrete region and the second structural layer being separate from the oxide layer, the process further comprising etching a via opening through the oxide layer above the discrete region to electrically connect the discrete region and the second structural layer, and wherein the via opening is covered with the barrier layer.

9. A process as recited in claim 1, further comprising:

forming an oxide layer over the barrier layer; and etching an opening in the oxide layer with an etchant, wherein the barrier layer functions as an etch stop to substantially prevent the etchant from contacting the discrete region.

10. A process as recited in claim 1, wherein exposing the surface of the discrete region is accomplished by disposing the semiconductor substrate in a CVD reaction chamber and introducing a feed stream containing an inert carrier, the metal containing source gas and the ozone gas into the reaction chamber.

11. A process as recited in claim 10, wherein the barrier layer is selected from the group consisting of a conductive metal oxide film, Ru oxide film, and aluminum oxide film.

12. A process as recited in claim 1, wherein said barrier layer of metal oxide film is formed at a temperature within the range from about 300° C. to about 1000° C.

13. A process of creating a barrier layer on a semiconductor substrate comprising:

forming a discrete region in the semiconductor substrate;

exposing a surface of the discrete region to ozone gas and to a source gas selected from the group consisting of aluminum trimethane, aluminum tetramethane, titanium tetramethane, a vaporized tantalum in the form of an organometallic compound, trimethyl aluminum hydrate, and a Ru or Mo metalorganic precursor to react the source gas with the ozone gas and deposit from said reaction a barrier layer of metal oxide film on the surface of the discrete region.

14. A process as recited in claim 13, wherein said metal oxide film is deposited at a temperature within the range from about 300° C. to about 1000° C.

15. A process for creating a barrier layer on a semiconductor substrate comprising:

forming a discrete region in the semiconductor substrate;

covering the discrete region with an oxide layer;

etching a contact opening through the oxide layer to contact the discrete region;

exposing the surface of the discrete region to a metal-containing source gas and to ozone gas to react the source gas with the ozone gas to deposit a barrier layer of metal oxide film on the surface of the discrete region, wherein the surface of the contact opening is covered with the barrier layer, and the source gas is selected from the group consisting of aluminum trimethane, aluminum tetramethane, titanium tetramethane, a vaporized tantalum in the form of an organometallic compound, trimethyl aluminum hydrate, and a Ru or Mo metalorganic precursor;

forming a structural layer over the barrier layer, said structural layer being prevented by the barrier layer from reacting with the discrete region; and metallizing the contact opening with a metallization material, wherein the barrier layer functions as a diffusion barrier to substantially prevent the metallization material from contacting the discrete region and wherein the diffusion barrier covers the discrete region.

16. A process as recited in claim 15, wherein said metal oxide film is deposited at a temperature within the range from about 300° C. to about 1000° C.

* * * * *